US012587188B2

(12) United States Patent
Wang et al.

(10) Patent No.: US 12,587,188 B2
(45) Date of Patent: Mar. 24, 2026

(54) POWER MODULES FOR CIRCUIT PROTECTION

(71) Applicant: NUtech Ventures, Lincoln, NE (US)

(72) Inventors: Jun Wang, Lincoln, NE (US); Ekaterina Muravleva, Lincoln, NE (US)

(73) Assignee: Nutech Ventures, Lincoln, NE (US)

( * ) Notice: Subject to any disclaimer, the term of this patent is extended or adjusted under 35 U.S.C. 154(b) by 461 days.

(21) Appl. No.: 18/175,980

(22) Filed: Feb. 28, 2023

(65) Prior Publication Data

US 2023/0283278 A1 Sep. 7, 2023

Related U.S. Application Data

(60) Provisional application No. 63/315,195, filed on Mar. 1, 2022.

(51) Int. Cl.
*H01L 23/00* (2006.01)
*H01L 23/62* (2006.01)
*H03K 17/687* (2006.01)

(52) U.S. Cl.
CPC ......... *H03K 17/6871* (2013.01); *H01L 23/62* (2013.01); *H01L 24/72* (2013.01)

(58) Field of Classification Search
CPC ................................ H01L 23/62; H01L 24/72
See application file for complete search history.

(56) References Cited

U.S. PATENT DOCUMENTS

| | | | | |
|---|---|---|---|---|
| 7,005,739 | B2 * | 2/2006 | Kaufmann | ............ H01L 25/112 257/710 |
| 9,035,447 | B2 * | 5/2015 | Dugal | .................. H01L 23/585 257/688 |
| 10,770,420 | B2 * | 9/2020 | Fujita | ...................... H01L 25/07 |
| 10,797,586 | B2 | 10/2020 | Drofenik et al. | |
| 12,449,825 | B2 * | 10/2025 | Ogawa | ................. G05D 7/0652 |

(Continued)

FOREIGN PATENT DOCUMENTS

| | | | | | |
|---|---|---|---|---|---|
| CN | 113013147 | A | * | 6/2021 | ............. H01L 23/16 |
| DE | 102022209559 | A1 | * | 2/2024 | ........... H01L 25/072 |

(Continued)

OTHER PUBLICATIONS

Dugal et al. "IGBT Press-packs for the industrial market" *A product brochure of StakPak* (2012).

(Continued)

*Primary Examiner* — David A Zarneke
(74) *Attorney, Agent, or Firm* — Gerald T. Gray; Leydig, Voit & Mayer, LTD

(57) ABSTRACT

An electronic module is provided, which comprises a plurality of first field effect transistors (FETs), a plurality of second FETs paired with the first FETs, a controller connected to gate nodes of the first and second FETs, and a plurality of spring assemblies disposed between the paired first and second FETs. Each spring assembly has two ends comprises a disc spring that is clamped and at least one conductive path that connects both ends of the spring assembly. One end of the spring assembly is connected to a press-buffer that contacts at least one first FET, while the other end is connected to another press-buffer that contacts at least one second FET.

20 Claims, 12 Drawing Sheets

(56)                References Cited

U.S. PATENT DOCUMENTS

| 2013/0043579 A1* | 2/2013 | Dugal | H01L 23/051 |
| | | | 257/690 |
| 2024/0213106 A1* | 6/2024 | Simpson | H01L 24/72 |

FOREIGN PATENT DOCUMENTS

| EP | 3057232 A1 | 2/2015 | |
| WO | WO-2024010901 A1 * | 1/2024 | H01L 23/49811 |

OTHER PUBLICATIONS

Simpson et al., "Press-pack IGBT Application Manual" *A product brochure of Dynex* (2019).
Papadopoulos, Georgios, "State-of-the-art DC Current Interruption Concept using SiC MOSFETs" *Master's Thesis* describing the use of a SiC solid-state circuit breaker for a DC current (section 6) (2019).

\* cited by examiner

600

610

620

630

640

650

660

POWER MODULES FOR CIRCUIT PROTECTION

CROSS-REFERENCES TO RELATED APPLICATIONS

This application claims the benefit of U.S. Provisional Application No. 63/315,195 titled "PASSIVELY COOLED ULTRA-EFFICIENT AND RELIABLE INTELLIGENT POWER MODULE FOR MVDC SOLID-STATE CIRCUIT BREAKERS," filed Mar. 1, 2022, the entire contents of which is incorporated herein by reference.

TECHNICAL FIELD

The present disclosure relates to circuit protection technology. More specifically, the embodiments set forth below describe power modules for solid state circuit breakers.

BACKGROUND

Medium-voltage direct current (MVDC) distribution systems are emerging solutions to integrate renewable and electrified energy sources and loads with high efficiency, high density, and high performance. FIG. 1A shows an exemplary MVDC distribution system 100. In the MVDC distribution system 100, various types of energy sources may be connected to a direct current (DC) bus 110, e.g., a twelve kilovolts (kV) DC bus, through circuit components 112. The energy sources may include renewable energy sources, such as solar or wind power systems, as well as traditional energy sources, such as electric generators. The circuit components 112 may facilitate circuit protection and/or power conversion, for example, stepping up/down input power, or converting between alternating current (AC) and DC power. The MVDC distribution system 100 may include multiple dc buses with different voltages, where similar circuit components may be utilized for power conversion and/or circuit protection. Such architecture allows various types of loads to be connected to specific dc buses according to the power requirements thereof. As shown in FIG. 1A, there may be a three kilovolts dc bus 120 and a one thousand volts dc bus 130 converted from the twelve kilovolts DC bus 110. Loads with high power requirements such as electric vehicles and facilities may draw power from the three kilovolts dc bus 120, while small appliances such as fans and light bulbs may draw power from the one thousand volts dc bus 130.

In MVDC systems, DC circuit breakers (e.g., the element 132 in FIG. 1A) act as vital protection devices to promptly isolate and reconfigure faulty subsystems (e.g., energy source or load systems). A solid-state circuit breaker (SSCB) that is fully electrified, compared to its mechanical and hybrid counterparts, excels with exceptionally shorter breaking time, longer life, higher density and simplicity, and infinite possibilities of intelligence. Yet, an SSCB's low efficiency and bulky cooling system remain its Achilles' heel because of limited semiconductor technologies. Silicon (Si) integrated gate-commutated thyristors (IGCTs) and insulated-gate bipolar transistors (IGBTs) are widely used to build SSCBs. FIG. 1B shows a switch 150 in an SSCB module, which is built from two Si-IGCTs 152 and two bipolar transistors 154. FIG. 1C shows a switch 160 in an SSCB module, which is built from two IGBTs 162 and two bipolar transistors 164. The switches modules 150 and 160 shown in FIGS. 1B and 1C, respectively, inevitably generate high conduction losses due to inherent offset voltages. There is a need for addressing these issues and/or other issues associated with the prior art.

SUMMARY

In an exemplary embodiment, an electronic module is provided. The electronic module comprises a plurality of first field effect transistors (FETs), a plurality of second FETs, a controller, and a plurality of spring assemblies. Each second FET of the plurality of second FETs pairs with a respective first FET of the plurality of first FETs. The controller is connected to gate nodes of the plurality of first FETs and the plurality of second FETs. The plurality of spring assemblies are disposed between the plurality of first FETs and the plurality of second FETs and pairing with the respective first FETs of the plurality of first FETs. Each spring assembly of the plurality of spring assemblies comprises a disc spring that is clamped and at least one conductive path that connects both ends of the spring assembly. Each spring assembly has two ends, one end is connected to a press-buffer that contacts at least one first FET and the other end is connected to another press-buffer that contacts at least one second FET. Drain nodes of the plurality of first FETs are connected to a first electrode plate, and drain nodes of the plurality of second FETs are connected to a second electrode plate. Each source node of the plurality of first FETs is connected to one end of a respective spring assembly, and each source node of the respective plurality of second FETs pairing with the plurality of first FETs is connected to the other end of the respective spring assembly.

In a further exemplary embodiment, the plurality of first FETs and the plurality of second FETs operate in a normally-on or a normally-off state.

In a further exemplary embodiment, the electronic module further comprises one or more current sensors connected to the controller. Each current sensor comprises a sensing element based on tunnel magnetoresistance (TMR) and a Rogowski coil. Each of the one or more current sensors is disposed in a path enclosing a drain-source path of at least one FET.

In a further exemplary embodiment, the electronic module further comprises one or more temperature sensors connected to the controller. Each of the one or more temperature sensors is attached to a FET of the plurality of first FETs or the plurality of second FETs.

In a further exemplary embodiment, the electronic module further comprises a communication interface. The communication interface is connected to the controller and configured to report diagnosis, prognosis, and health status of the electronic module to an external device via the communication interface.

In a further exemplary embodiment, the plurality of first FETs and the plurality of second FETs are made of silicon carbide (SiC) or gallium nitride (GaN).

In a further exemplary embodiment, each press-buffer has two or more legs and each leg of a press-buffer is connected to a FET of the plurality of first FETs or the plurality of second FETs.

In a further exemplary embodiment, each spring assembly is connected to two or more first FETs of the plurality of first FETs and two or more respective second FETs of the plurality of second FETs that are paired with the two or more first FETs.

In a further exemplary embodiment, the plurality of first FETs and the plurality of second FETs are fabricated on FET dies. Each FET die comprises at least one FET of the plurality of first FETs or the plurality of second FETs.

In a further exemplary embodiment, the electronic module comprises hybrid electrical connections. The hybrid electrical connections comprise wire-bonding for the gate nodes of the plurality of FETs, sintering or soldering for the drain and source nodes of the plurality of FETs, and dry contacts for the plurality of spring assemblies.

In another exemplary embodiment, an electronic device is provided. The electronic device comprises a plurality of electronic modules, a control circuit connected to the plurality of electronic modules, and a frame providing mechanical support to and electrical connections between the plurality of electronic modules and the control circuit. Each electronic module among the plurality of electronic modules comprises a plurality of first field effect transistors (FETs), a plurality of second FETs, a controller, and a plurality of spring assemblies. Each second FET of the plurality of second FETs pairs with a respective first FET of the plurality of first FETs. The controller is connected to gate nodes of the plurality of first FETs and the plurality of second FETs. The plurality of spring assemblies are disposed between the plurality of first FETs and the plurality of second FETs and pairing with the respective first FETs of the plurality of first FETs. Each spring assembly of the plurality of spring assemblies comprises a disc spring that is clamped and at least one conductive path that connects both ends of the spring assembly. Each spring assembly has two ends, one end is connected to a press-buffer that contacts at least one first FET and the other end is connected to another press-buffer that contacts at least one second FET. Drain nodes of the plurality of first FETs are connected to a first electrode plate, and drain nodes of the plurality of second FETs are connected to a second electrode plate. Each source node of the plurality of first FETs is connected to one end of a respective spring assembly, and each source node of the respective plurality of second FETs pairing with the plurality of first FETs is connected to the other end of the respective spring assembly.

In a further exemplary embodiment, each electronic module among the plurality of electronic modules further comprises one or more current sensors connected to the controller. Each current sensor comprises a sensing element based on tunnel magnetoresistance (TMR) and a Rogowski coil. Each of the one or more current sensors is disposed in a path enclosing a drain-source path of at least one FET.

In a further exemplary embodiment, each electronic module among the plurality of electronic modules further comprises one or more temperature sensors connected to the controller. Each of the one or more temperature sensors is attached to a FET of the plurality of first FETs or the plurality of second FETs.

In a further exemplary embodiment, each electronic module among the plurality of electronic modules further comprises a communication interface. The communication interface is connected to the controller and configured to report diagnosis, prognosis, and health status of the electronic module to an external device via the communication interface.

In a further exemplary embodiment, the plurality of first FETs and the plurality of second FETs are made of silicon carbide (SiC) or gallium nitride (GaN).

In a further exemplary embodiment, each press-buffer has two or more legs and each leg of a press-buffer is connected to a FET of the plurality of first FETs or the plurality of second FETs. Each spring assembly is connected to two or more first FETs of the plurality of first FETs and two or more respective second FETs of the plurality of second FETs that are paired with the two or more first FETs.

In a further exemplary embodiment, each electronic module among the plurality of electronic modules comprises hybrid electrical connections. The hybrid electrical connections comprise wire-bonding for the gate nodes of the plurality of FETs, sintering or soldering for the drain and source nodes of the plurality of FETs, and dry contacts for the plurality of spring assemblies.

In a further exemplary embodiment, the plurality of first FETs and the plurality of second FETs are fabricated on FET dies. Each FET die comprises at least one FET of the plurality of first FETs or the plurality of second FETs.

In a further exemplary embodiment, the plurality of electronic modules are arranged in an N+1 configuration.

In a further exemplary embodiment, each of the plurality of electronic modules is replaceable.

Reference to the remaining portions of the specification, including the drawings and claims, will realize other features and advantages of the present invention. Further features and advantages of the present invention, as well as the structure and operation of various embodiments of the present invention, are described in detail below with respect to the accompanying drawings. In the drawings, like reference numbers indicate identical or functionally similar elements.

DETAILED DESCRIPTION

Figure 1A:
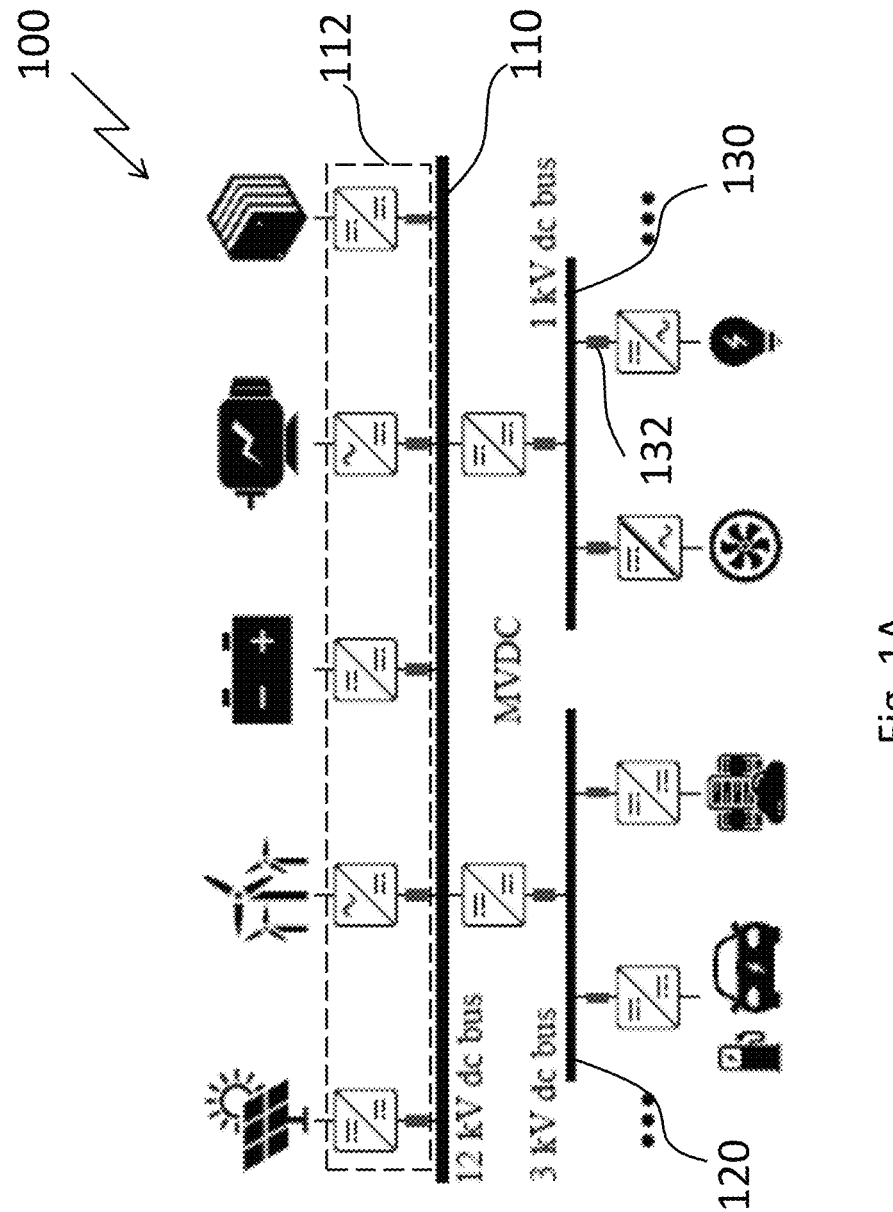
FIG. 1A shows an exemplary MVDC distribution system.
Figure 1C:
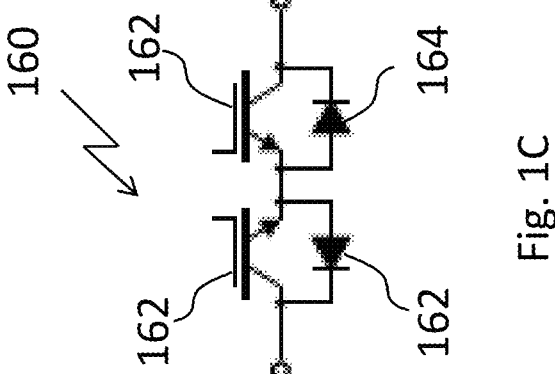
FIG. 1C shows a switch in an SSCB module.
Figure 1B:
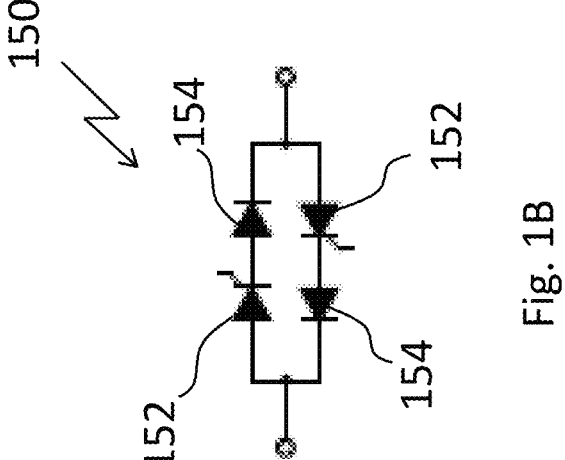
FIG. 1B shows a switch in an SSCB module.
Figure 2:
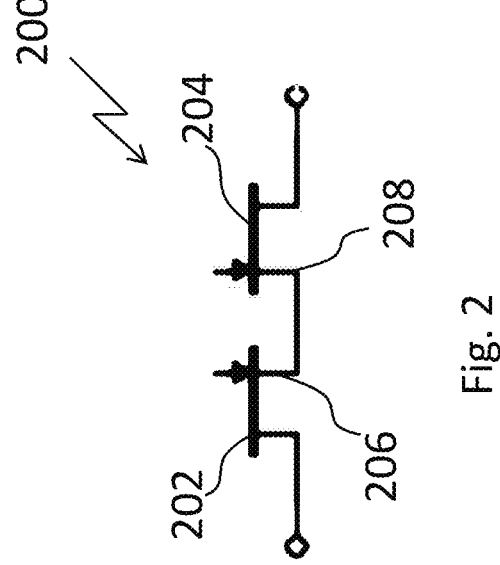
FIG. 2 demonstrates an exemplary bidirectional switch.

FIG. 2 demonstrates an exemplary bidirectional switch 200 in accordance with one or more embodiments of the present disclosure. The switch 200 may include a pair of field effect transistors (FETs) 202 and 204 in an anti-series configuration. The symmetrical arrangement of the pair of FETs allows the switch 200 to be used bidirectionally. As such, an SSCB constructed by one or more switches 220 in a parallel arrangement may also operate bidirectionally. The FETs 202 and 204 in the bidirectional switch 200 may operate in a normally-on state or a normally-off state.

Various types of FETs may be used to form the switch 200, such as metal-oxide-semiconductor FETs (MOSFETs) or junction-gate FETs (JFETs). Depending on the substrate materials, FETs may be constructed as n-channel or p-channel devices, where n-channel consists of mostly electrons as carriers and p-channel consists of mostly holes as carriers. Furthermore, there are many options for substrate materials for FETs, such as group IV compounds like silicon-carbide (SiC), or group III-V compounds like gallium-nitride (GaN), which may be considered based on different usage scenarios and/or different power requirements.

In the example as shown in FIG. 2, the switch 200 may include two n-channel JFETs, and the source node 206 of the JFET 202 and the source node 208 of the JFET 204 may be directly connected. In a further example, the JFETs 202 and 204 may be made of SiC. SiC JFETs are a junction-based normally-on transistor type with very low on-resistance, which enables a switch 200 formed from a pair of SiC JFETs to overcome inherent offset voltage limitations and achieve reduced conduction losses. SiC MOSFETs have similar advantages. It will be recognized by those skilled in the art that the techniques disclosed herein may be extended to power modules/devices built on other types of FETs for any suitable applications.

As mentioned above, emerging SiC FET modules do not have the limitations of inherent offset voltages and high conduction losses in the prior art. However, SiC FET modules have been continually optimized for high-switching-frequency operations other than SSCBs with constant conduction and occasional switching. In embodiments of the present disclosure, a plurality of SiC FET-based bidirectional switches 200 may be arranged in parallel to form an SSCB device, which allows the elimination of active cooling and can achieve up to 7.5 times reduction in conduction resistance, up to five times increase in power density, and up to 90 percent reduction in power loss compared with best-in-class products.

Figure 3B:
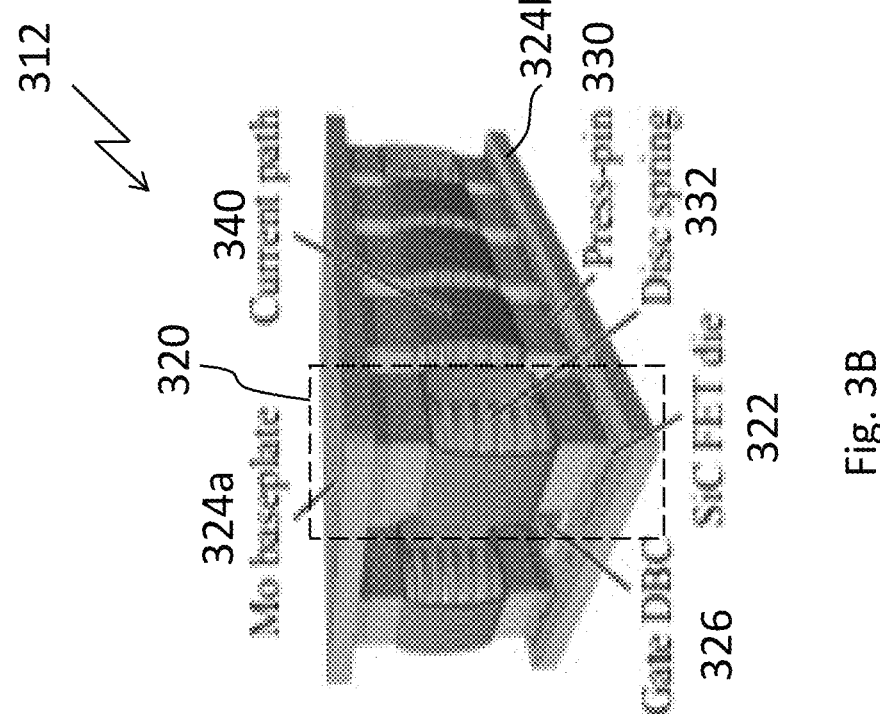
FIG. 3B a side view of an exemplary submodule as shown in FIG. 3A.
Figure 3A:
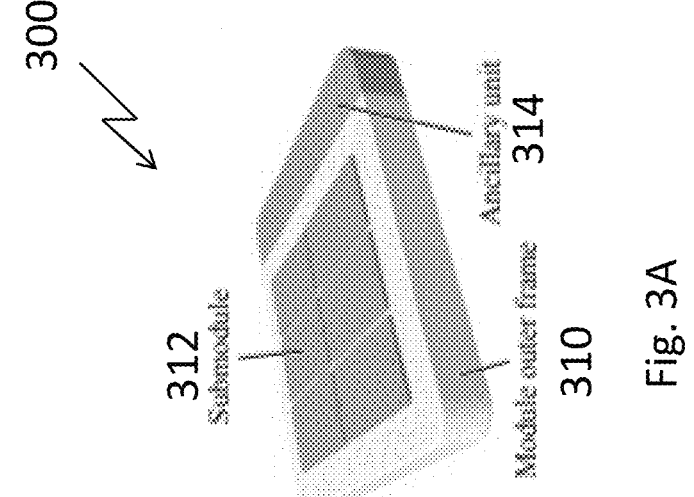
FIG. 3A demonstrates an exemplary SiC FET module.

FIG. 3A demonstrates an exemplary SiC FET module 300 according to an embodiment. The SiC FET module 300 is referred to as ηPak. The ηPak 300 may include a plurality of bidirectional switches 200 as shown in FIG. 2, which may be optimized for MVDC SSCBs and arranged in specific configurations to address issues with efficiency and bulky cooling systems. The ηPak 300 may achieve (1) an efficiency greater than 99.983 percent; (2) a power density greater than 300 kilowatts per liter (kW/l) and a specific power greater than 150 kilowatts per kilogram (kW/kg); (3) passive cooling; (4) systematically enhanced robustness; and (5) unrestricted voltage and current scaling. Such enhanced performance may be attained in an embodiment by using: 1) back-to-back press-pack packaging of enormous-scale SiC FET dies; 2) fault-tolerant designs; 3) bidirectional supercascode clamping circuit; and 4) integrated sensors and online fault diagnosis and prognosis. As a result, the SiC FET module may remove up to 90 percent of power losses from best-in-class SSCBs, posing a disruptive techno-economic impact in the current and future MVDC areas, such as electric vehicle supercharging stations, utility-scale energy storage units, and shipboard and aviation DC systems.

As shown in FIG. 3A, the ηPak 300 may include a module outer frame 310, one or more submodules 312, and an ancillary unit 314. The module outer frame 310 may provide mechanical support/protection for the submodules 312 disposed thereon and the ancillary unit 314 integrated thereto. Additionally, the module outer frame 310 may provide electrical connections between the one or more submodules 312 and the ancillary unit 314 in the ηPak 300, and/or provide electrical connections to circuits or electrical components external to the ηPak 300. The submodules 312 may include multiple switches 200 in a parallel arrangement. The ancillary unit 314 may include control circuits, peripheral circuits, sensor elements, and any other suitable circuits or circuit components. In an example, the ancillary unit 314 may include power supplies, gate drivers, sensors, and an ηPak controller. The ancillary unit 314 may control the operation of the FETs in the submodules 312 through the gate drivers and the ηPak controller, monitor the operating status through sensors, and optionally generate feedback signals based on the monitoring of the operating status.

The ηPak 300 may be scaled by integrating various numbers of submodules 312. Additionally and/or alternatively, the submodule 312 may integrate various numbers of FETs or FET dies. In an example, an ηPak module 300 with six submodules 312 may have dimensions of 250×240×35 cubic millimeters and a weight of 4.5 kilograms.

FIG. 3B is a side view of an exemplary submodule 312 as shown in FIG. 3A according to an embodiment. The submodule 312 may include a plurality of switches. Each switch may adopt the design of the bidirectional switch 200 as shown in FIG. 2. The plurality of switches in the submodule 312 may be arranged partially or fully in parallel. As shown in block 320, four pairs of SiC FETs may be connected to both ends of a connecting part to form a set of four switches. Each switch may be constructed from one pair of SiC FETs configured back-to-back in the vertical direction. As shown in FIG. 3B, the SiC FETs may be fabricated on SiC FET dies 322. In some examples, each SiC FET die 322 may include one SiC FET, a set of four SiC FETs, or other suitable number of FETs. One or more SiC FET dies 322 may be mounted or integrated on a baseplate. In this example, the submodule 312 may include a top baseplate 324*a* and a bottom baseplate 324*b*. Each of the baseplates may serve as an electrode plate. The baseplates may be made of substrates containing the element Molybdenum (Mo). The SiC FET die layout on the top baseplate 324*a* and the SiC FET die layout on the bottom baseplate 324*b* may be symmetrical, so that a SiC FET (or SiC FET die) on the top baseplate 324*a* and a corresponding SiC FET (or corresponding SiC FET die) on the bottom baseplate 324*b* may be conveniently connected by a connecting part. The SiC FET (or SiC FET die) on the top baseplate 324*a* and a corresponding SiC FET (or corresponding SiC FET die) on the bottom baseplate 324*b* may be referred to as a pair of SiC FETs or (a pair of SiC FET dies). On either or both of the top and bottom baseplates 324*a* and 324*b*, a direct bonded copper (DBC) layout 326 may be fabricated, which may be used for gate control of the FETs connected thereto.

The connecting part may be composed of a pair of four-leg press-pins 330 in a back-to-back structure, with a spring assembly coupled therebetween. The spring assembly may have two ends, and the two ends of the spring assembly may be connected by one or more conductive paths 340 to allow current to flow between a pair of SiC FETs 322. The one or more conductive paths 340 may be made of metal, semiconductor, graphene, or other conductive materials. The spring assembly may include a disc spring 332 connected between the two ends of the spring assembly. The disc spring 332 may be clamped. Each end of the spring assembly may be connected to a press-buffer and the press buffer may contact one or more SiC FET dies 322. In this example, the press-buffer may include a four-leg press-pin 330, and each leg of the press-pin may contact one SiC FET on a corresponding SiC FET die 322 on a baseplate (324*a* or 324*b*). As such, the four-leg press-pin 330 connected to one end of the spring assembly may contact four SiC FETs on one or more SiC FET dies 322 on a baseplate. The pair of four-leg press-pins 330 connected to both ends of the spring assembly may contact four pairs of SiC FETs (or SiC FET dies 322) on the top and bottom baseplates (324a and 324b, respectively) as shown in FIG. 3B.

Figure 4:
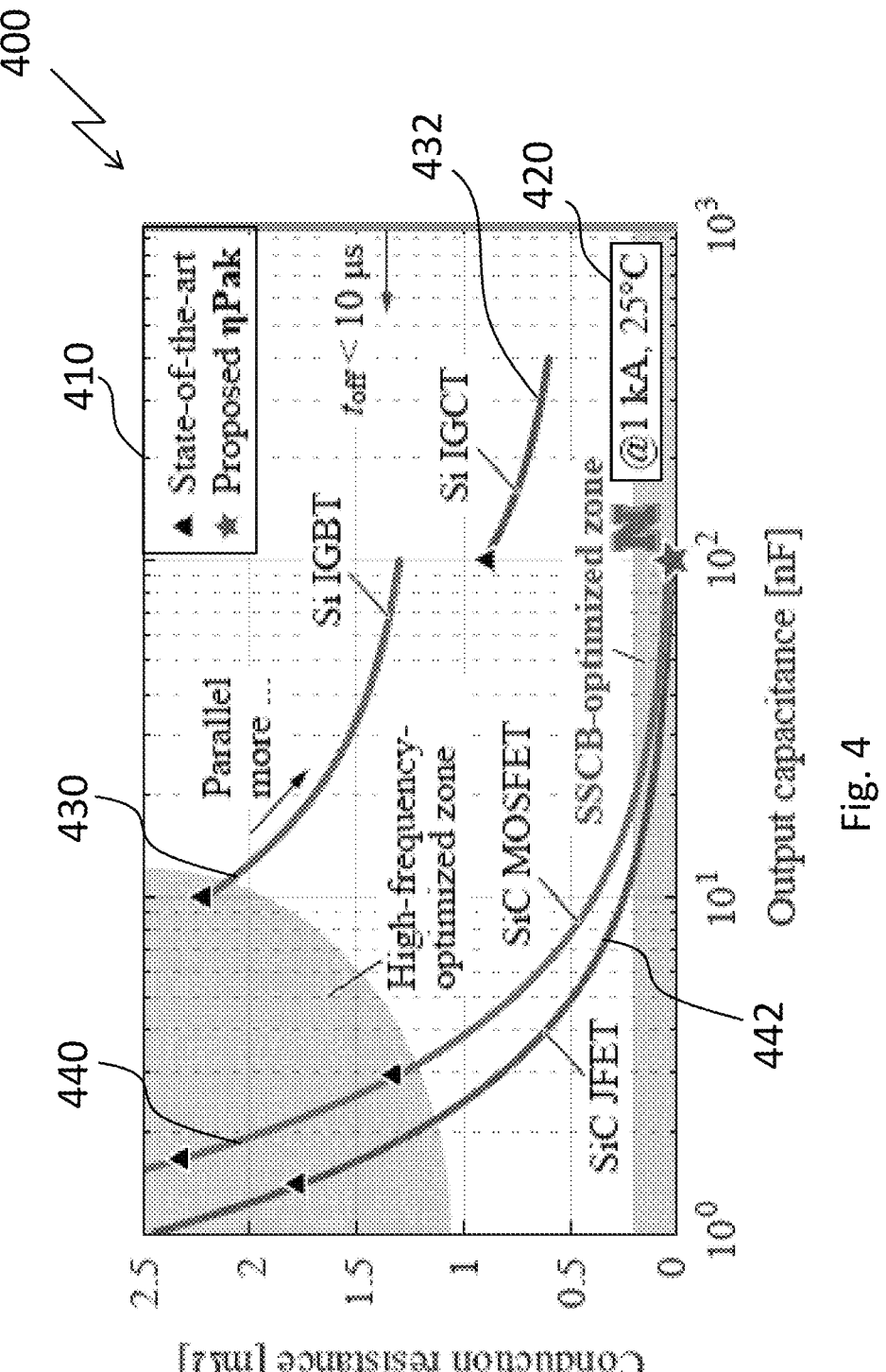
FIG. 4 shows a figure of merit (FOM) map of state-of-art power modules.

It has been an intuitive approach to parallel more power devices for a lower conduction loss. Yet, parallel merely yields a limited gain when applied to junction-conduction devices, such as IGBTs and IGCTs. FIG. 4 is a figure of merit (FOM) map 400 of state-of-art power modules. As indicated in legend 410, a solid triangle represents a state-of-the-art product and a solid Pentagram or star represents the ηPak of the present disclosure. In the FOM map 400, the horizontal axis represents output capacitance in nano-farads (nF) in logarithmic (log) scale and the vertical axis represents conduction resistance in milli-ohm (mΩ) in logarithmic (log) scale. Block 420 indicates the products as shown in FIG. 4 are compared at the same conditions, i.e., at room temperature (i.e., 25 Celsius) and one kilo-ampere (kA) operating current. Curve 430 indicates a trend that the equivalent resistance of a Si IGBT product decreases as the parallel connection increases. Curve 432 indicates a trend that the equivalent resistance of a Si IGCT product decreases as the parallel connection increases. Similarly, curves 440 and 442 indicate trends associated with a SiC MOSFET product and a SiC JFET product, respectively.

As shown in FIG. 4, the reduction of equivalent resistance of Si IGBT and IGCT saturates rapidly with increased parallel numbers due to the inherent forward-biased PN junction voltage. In contrast, the emerging purely resistive, channel-conduction SiC FETs are not subjected to this physical constraint, but the existing SiC FET modules only embody a limited number of dies to strike a balance among conduction loss, switching loss, and switching speed. However, none of today's power modules are optimized for SSCBs, and consequently, employing these power modules hits an efficiency limit.

Figure 5:
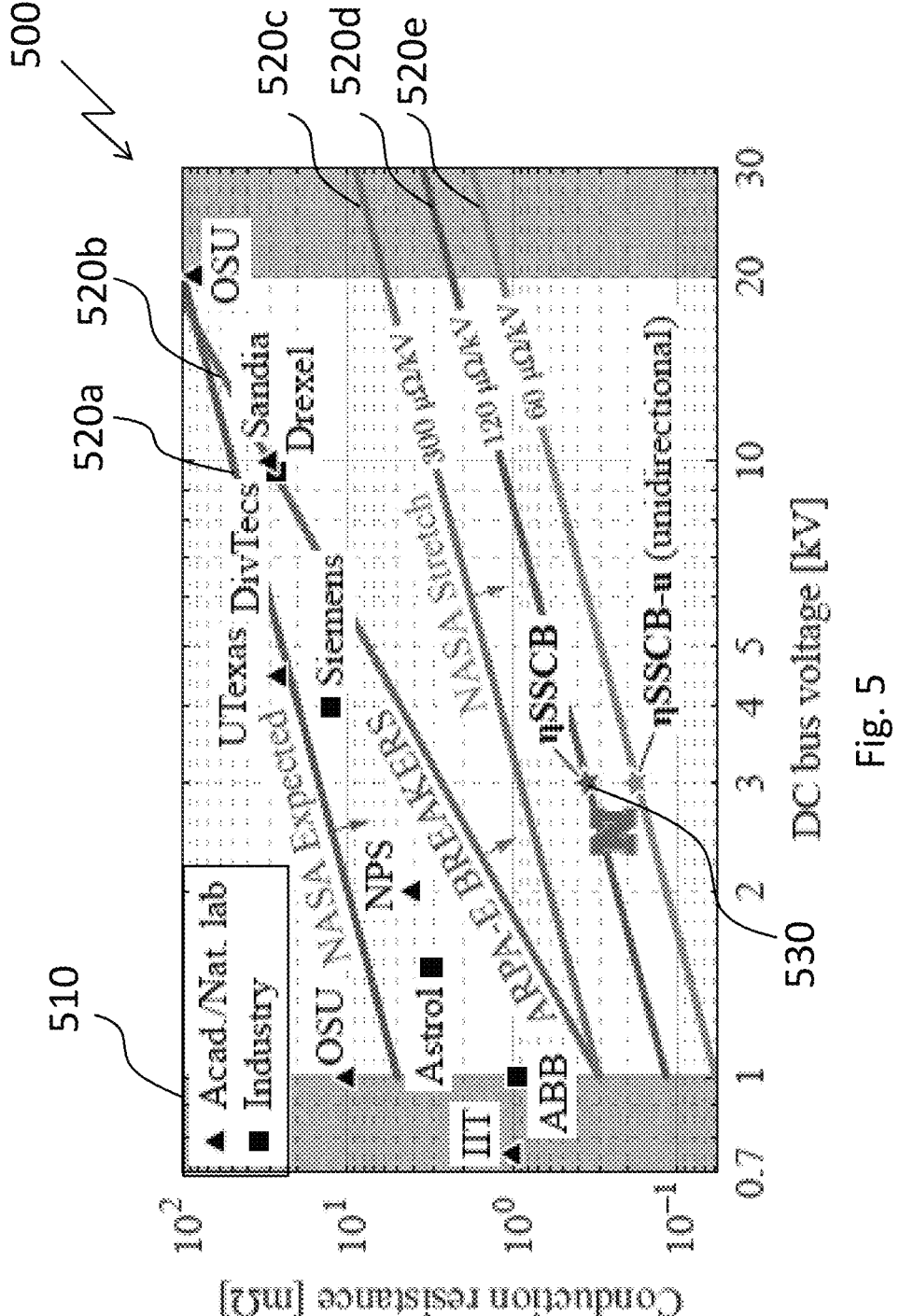
FIG. 5 shows a state-of-the-art SSCB efficiency landscape in academia, national lab, and industry.

FIG. 5 shows a state-of-the-art SSCB efficiency landscape 500 in academia, national lab, and industry. In the landscape 500, the horizontal axis represents DC bus voltage in kV in logarithmic scale, and the vertical axis represents conduction resistance in milli-ohm (mΩ) in logarithmic scale. As indicated in legend 510, a solid triangle represents a SSCB product from academia/national lab, and a solid square represents a SSCB product from industry. There are multiple agency lines 520a-520e plotted in the landscape, and each agency line set forth specific requirements for power modules. For example, the requirement may include conduction resistance, DC bus voltage, efficiency, and/or other suitable parameters. Some of the requirements may be derived from certain parameters, such as conduction resistance and DC bus voltage. For instance, an SSCB resistance/voltage (R/V) ratio related to efficiency may be determined by calculating the ratio of conduction resistance and DC bus voltage. As shown in FIG. 5, the agency lines 520c, 520d, and 520e are labeled with R/V ratios of 300 microwatts per kilovolt (μΩ/kV), 120 μΩ/kV, and 60 μΩ/kV, respectively. The lower the R/V ratio, the higher the efficiency of the corresponding SSCB product. A triangle/square located below an agency line indicates the corresponding SSCB product meets a goal (e.g., efficiency) set forth by the particular agency line.

FIG. 5 reveals that the ambitious "Stretch" goal from NASA (i.e., the agency line labeled as "NASA Stretch"), which is associated with the agency line 520c, requires an SSCB R/V ratio below 300 μΩ/kV. The square labeled as "ABB" represents an SSCB product by ABB, which is disclosed in a literature to Qi et al., titled "Solid-State Circuit Breaker Protection for DC Shipboard Power Systems: Breaker Design, Protection Scheme, Validation Testing," published in IEEE Transactions on Industry Applications journal, at vol. 56, no. 2, pp. 952-960, March-April 2020. By developing a 900 μW/kV reverse-blocking IGCT for a shipboard SSCB product at 1 kV, 1 kiloampere (kA), and 99.9% efficiency, ABB is currently the closest to that goal but still three times inferior.

FIG. 4 indicates that paralleling more FET dies to pursue a considerable total conductive area may be the right path toward the SSCB-optimized zone. Hence, various embodiments of the present disclosure provide new packaging techniques embodying an enormous number of parallel SiC FET dies in a single module. In an embodiment, SSCBs may be formed based on multiple ηPak modules, which are referred to as ηSSCBs. For example, a star 530 as shown in FIG. 5 represents an ηSSCB 530 that includes five ηPak modules (in an N+1 configuration), each with a rating of 1.7 kV, 1 kA, and 100 μΩ. The ηSSCB 530 is built with 3 kV, 1 kA. Assuming a hundred percent voltage margin for the ηSSCB, when a 1.7 kV device blocks 850 V bus, the R/V ratio (or efficiency) may be calculated by 100μΩ/850V≈120μΩ/kV.

Owing to the extraordinarily low specific resistance of FETs and a novel back-to-back press-pack structure, a bidirectional ηPak module embodiment with the same footprint as a regular ABB StakPak IGBT can constitute 120μΩ/kV ηSSCBs for various voltages as shown in FIG. 5. The ηSSCBs may be 7.5 times better than best-in-class products and 2.5 times better than the "dream" NASA Stretch goal (the agency line 520c as shown in FIG. 5). Such a notable loss reduction can also eliminate the need for active cooling, rendering a potential five times increase in power density and a substantial boost in system-level reliability and adaptability. In further embodiments, implementations such as normally-on FETs, stable-short failure mode, N+1 redundancy, enhanced intelligence, or any combination thereof may be utilized to significantly improve the resilience of ηSSCBs in large stacks. Accordingly, these embodiments effectively tackle the most critical conduction loss problem, enabling ultra-efficient and robust SSCBs for a broad range of voltages, currents, and applications.

In an embodiment, at the module level, pursuing 100 micro-ohms (μΩ) device+packaging resistance, an ηSSCB may package 240 pairs of anti-series 5.7 milli-ohms (mΩ) FET dies, totaling 47.5 micro-ohms (μΩ) device resistance. For such an unprecedented number of dies, press-pack packaging (e.g., the connecting part as shown in FIG. 3B) is preferred to the alternative flat-pack option as the former has: (1) a sizeable conductive area and identical current paths for all dies; (2) long lifetime without bond-wire or DBC substrate; and (3) natural compatibility with anti-series connection. As FET dies are much smaller than IGBTs, the present disclosure provides, in an embodiment (e.g., in FIG. 3B), a pair of four-leg press-pins in a back-to-back structure with a disc spring in between. The disc spring may be clamped.

Figure 6A:
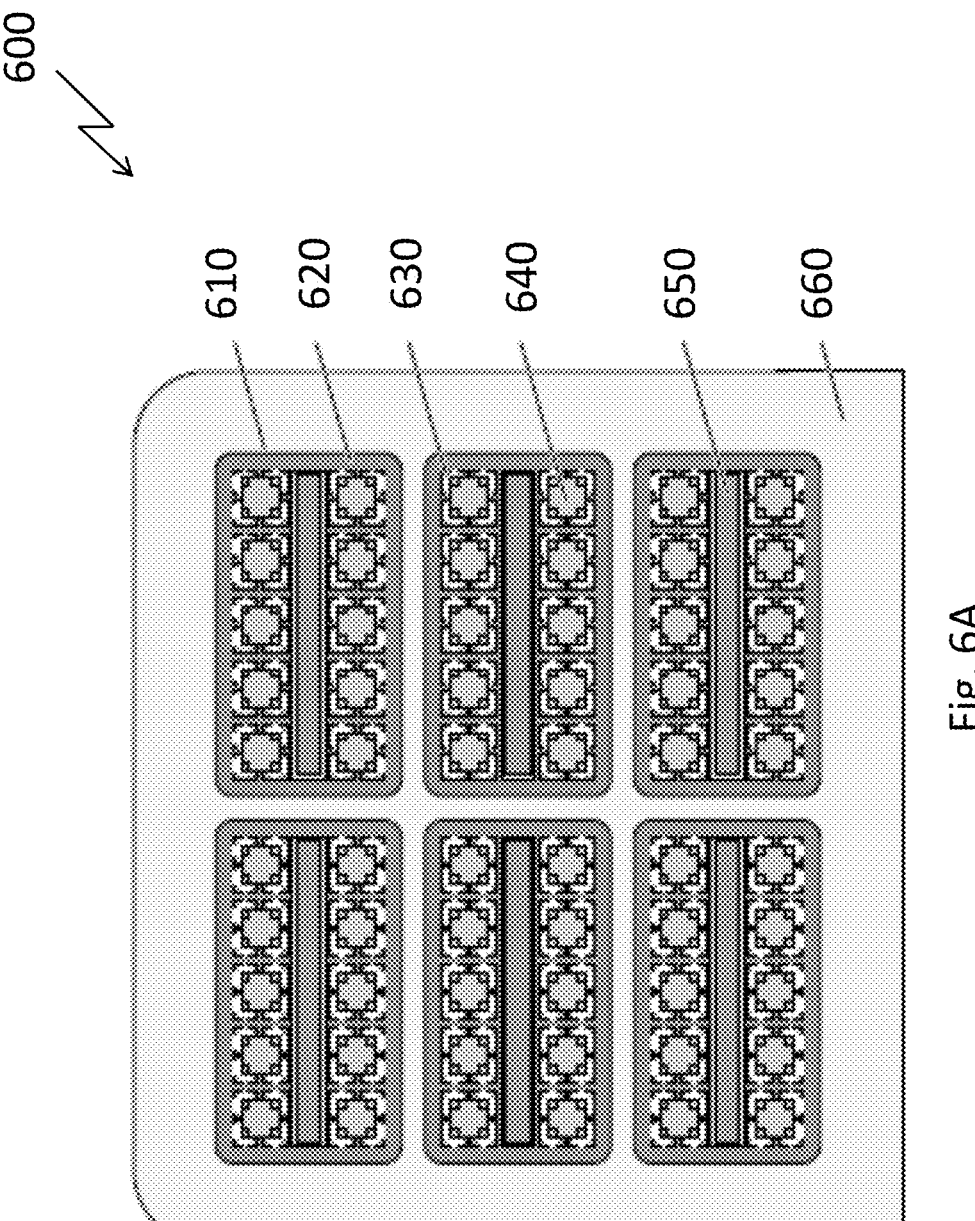
FIG. 6A shows an internal die layout in an ηPak module.

FIG. 6A shows an internal die layout 600 in an ηPak module, according to an embodiment. The ηPak module may be an ηPak 300 as shown in FIG. 3A. As shown in FIG. 6A, the ηPak module may include six submodules 610, which are integrated or mounted on a module outer frame 660. Each of the submodules 610 in the ηPak module may be replaceable.

Each submodule 610 may include a pair of baseplates 620, including a top baseplate and a bottom baseplate. The baseplates may serve as electrode plates. Each baseplate may have a plurality of SiC FET dies 630 integrated thereto or mounted thereon. The plurality of SiC FET dies may be arranged in sets 640, each set 640 having four SiC FET dies 630 in this example. The four SiC FET dies 630 in a set 640 may be arranged according to the layout of the four legs of the press-pin structure. As such, a press-pin (with four legs) and spring structure may be shared by four dies in a set. On either or both baseplate 620, a DBC layer 650 may be fabricated for gate connections for the SiC FETs.

As shown in FIG. 6A, each baseplate 620 may carry 40 SiC FET dies 630 in ten sets 640. The ten sets 640 of SiC FET dies may be arranged in a matrix configuration, for example two rows by five columns. As such, each submodule 610 may include 40 pairs of SiC FET dies 630 and ten springs. In an example, the SiC FET die may be UF3N170006, rated at 1.7 kV, 5.7 mW at 4.2 A and 45° C., with dimensions of 8×8 mm$^2$ and a fracture strength of 380 MPa. In this example, total die area may be 153.6 cm$^2$. The module loss may be 100 W at 1 kA, producing a 0.15 W/cm$^2$ heat flux from the dies. Even with passive cooling, the junction temperature rise can stay below 20° C. to mitigate a loss penalty from the positive temperature coefficient.

Figure 6B:
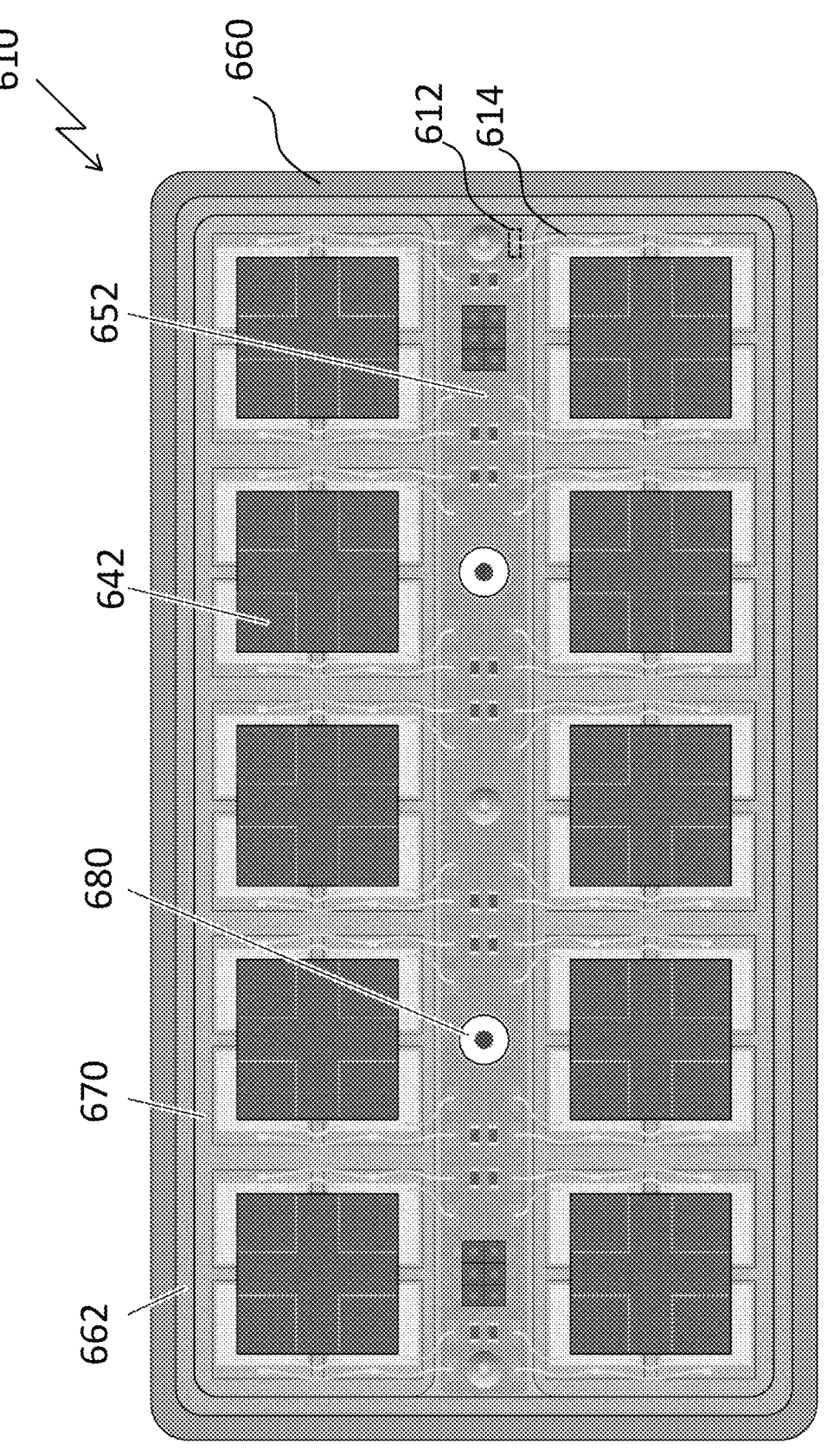
FIG. 6B shows an exemplary submodule with hybrid electrical interconnections.
Figure 10:
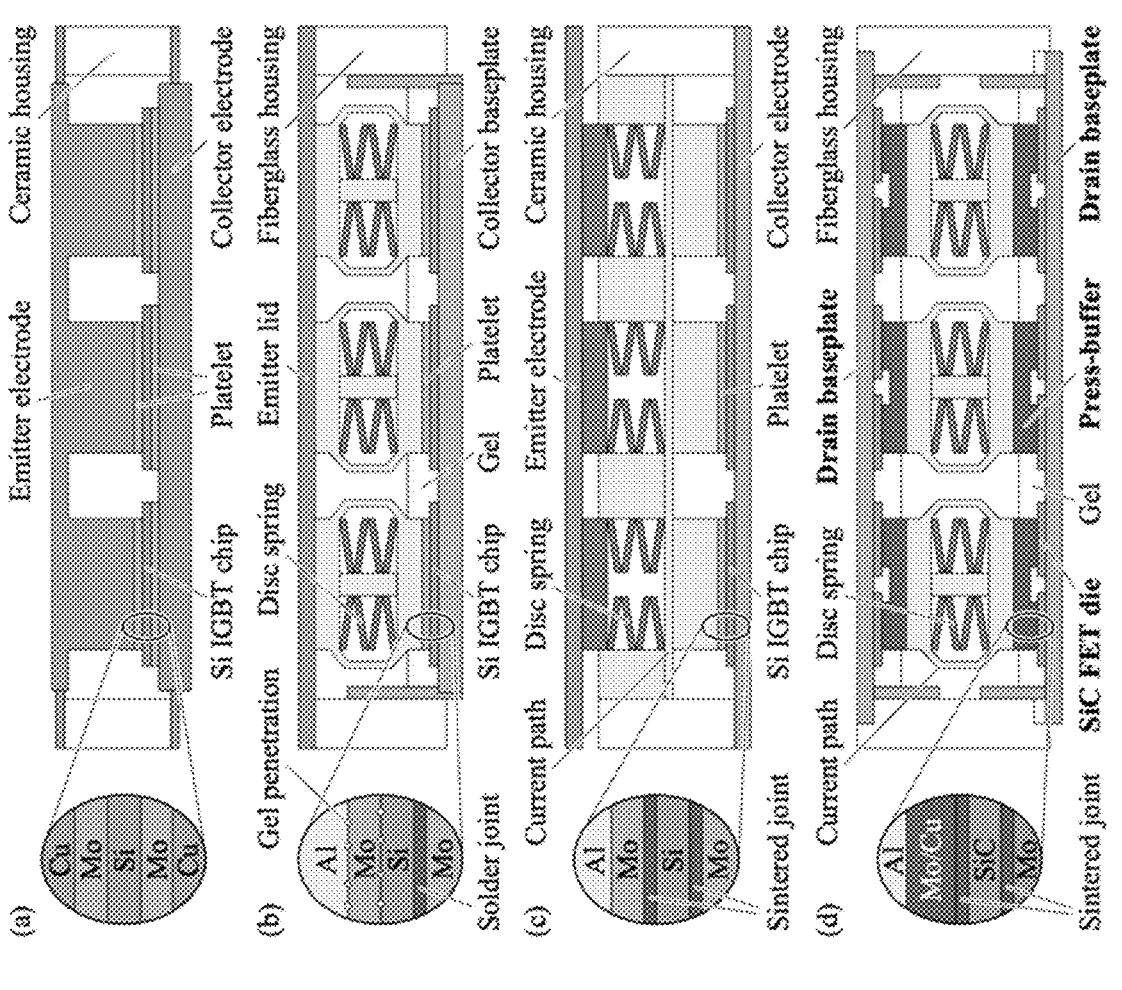
FIG. 10 compares different SSCB modules in a cross section view.

Electrical connections within ηPak modules may be of various types, such as wire-bonds, printed wiring boards (PWB), and printed circuit board (PCB). In some examples, an ηPak module may include hybrid electrical interconnections. FIG. 6B shows an exemplary submodule 610 with hybrid electrical interconnections. The submodule 610 may be one of a plurality of submodules disposed on the module outer frame 660. Components within the submodule 610, such as SiC FETs, electrode pads, and control circuitry, may be carried by an inner frame(s) 662, which may be integrated in or mounted on the module outer frame 660. A press-buffer 642 may include a four-leg press pin to engage a set of four FET dies. As shown in FIG. 6B, a gate PCB 652 may be disposed between the two rows of FET sets. The gate PCB 652 may be patterned with a plurality of gate pads (e.g., a gate pad in dashed box 612). Each gate pad may be connected to a gate node in a particular FET die. The connection between the gate pad and the gate node may be facilitated by wire-bonding (e.g., wire 614). In some instances, drain/source nodes (not shown in FIG. 6B) in the FET dies may be connected to corresponding drain/source pads (or electrode plates), respectively, through soldering or sintering joints (e.g., solder/sintered joints as shown in FIG. 10). Spring structures (e.g., spring assemblies or connecting parts) may be connected to the circuit via dry contacts. In a further example, at least a portion of the submodule may be covered by a gel layer 670. This may be facilitated by uniformly coating the submodule with the gel layer 670 during fabrication. Some areas in the submodule may be exposed out of the gel for further process. In this example, areas associated with the press-buffers and areas associated with the gate connectors on the gate PCB 652 may be exposed.

Figure 7:
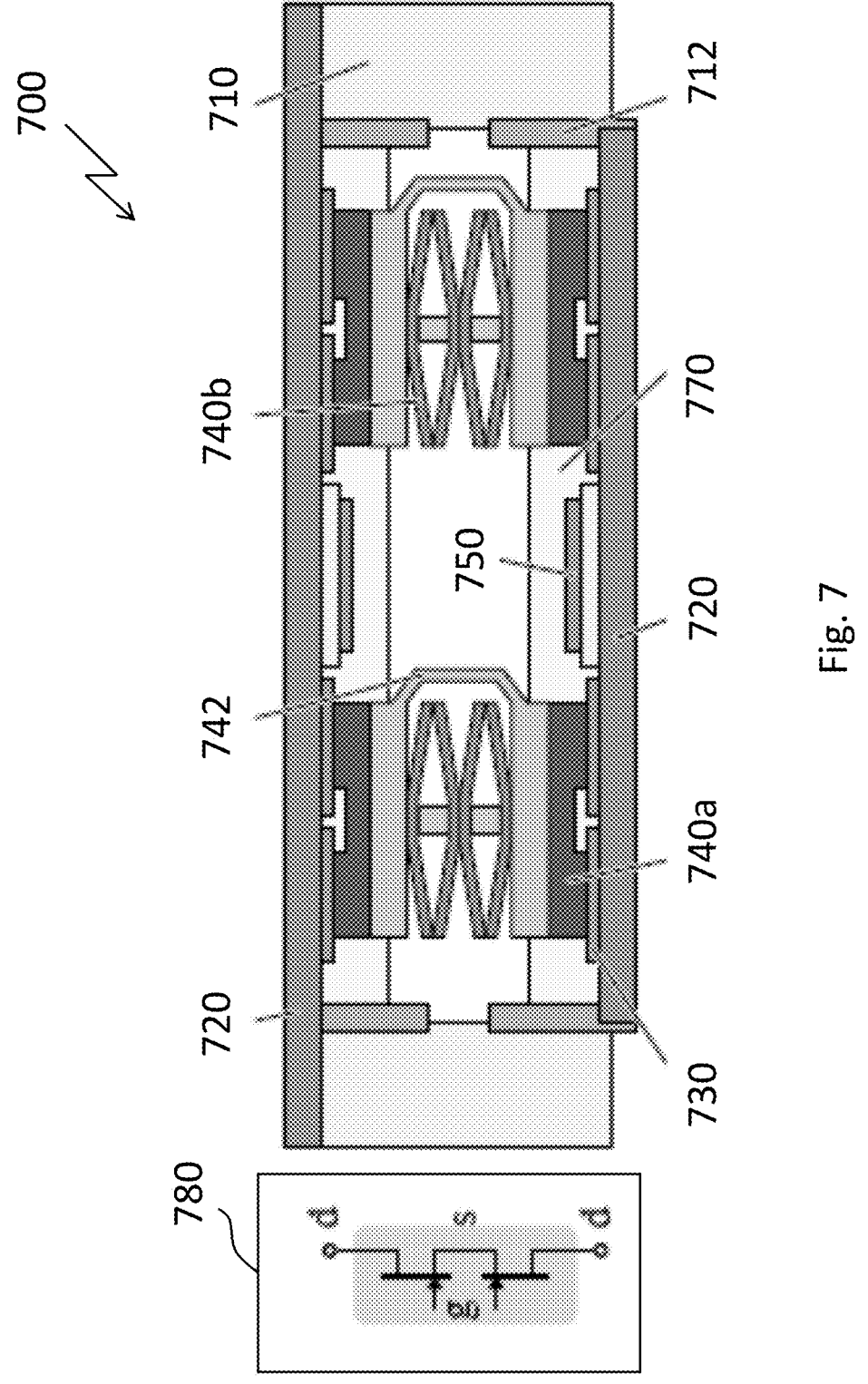
FIG. 7 is a cross-section view of an ηPak module.

FIG. 7 is a cross-section view 700 of an ηPak module, according to an embodiment. As shown in block 780, the ηPak module may be formed based on a pair of anti-series JFETs, where "g" represents gate node, "s" represents source node, and "d" represents drain node. The ηPak module includes two baseplates 720. The baseplates 720 may serve as electrode plates. Each baseplate 720 are integrated/mounted with SiC FET dies 730. The SiC FET dies 730 are contacted by press-pins 740a, which are connected to spring assemblies including disc springs 740b. The disc springs 740b may be clamped. As shown in FIG. 7, a press-pin and spring structure may contact pairs (e.g., four pairs) of SiC FET dies 730 at both ends thereof. Each press-pin and spring structure includes at least one current path 742 allowing current to flow between the corresponding pair(s) of SiC FET dies 730. The ηPak module includes gate DBC 750 for gate control of the FETs. Additionally, the ηPak module may include Silicone gel 770 that covers device regions (e.g., FET dies 730 and DBC 750) to protect the devices. The ηPak module may also include outer frames 710 and inner frames 712 to provide additional support or protection. The outer frames 710 and inner frames 712 may referred to frames outside and inside a submodule (e.g., 312 as shown in FIG. 3A), respectively.

Figure 8B:
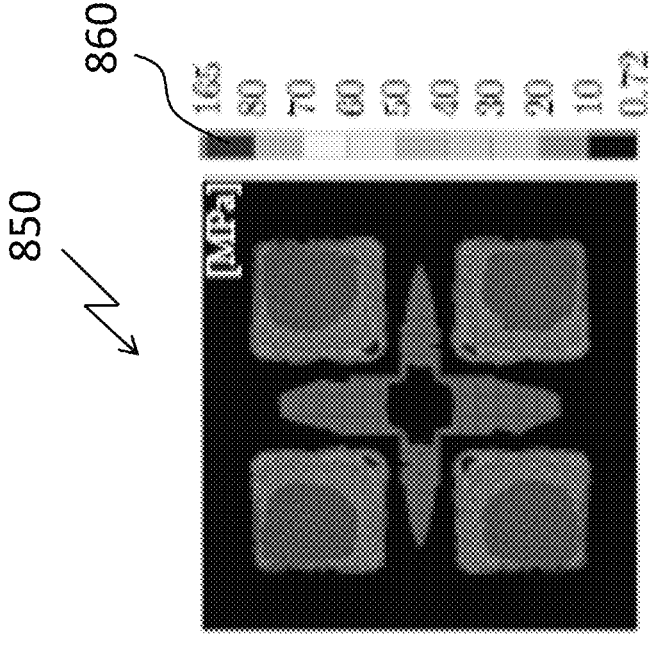
FIG. 8B is a stress map based on finite element analysis (FEA) for a four-leg press-pin on a set of four SiC FET dies.
Figure 8A:
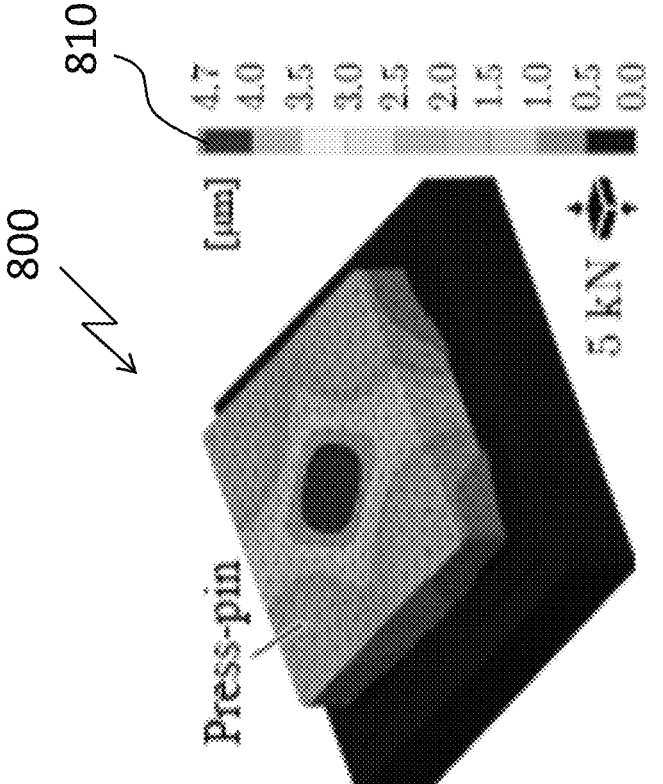
FIG. 8A is a deformation map based on finite element analysis (FEA) for a four-leg press-pin on a set of four SiC FET dies.

FIG. 8A is a deformation map 800 based on finite element analysis (FEA) for a four-leg press-pin on a set of four SiC FET dies. FIG. 8B is a stress map 850 based on finite element analysis (FEA) for the four-leg press-pin on the set of four SiC FET dies. The four SiC FET dies are connected to one end of the four-leg press-pin and spring structure as shown in FIG. 7.

The FEA simulations of deformation and stress are performed by imposing a five kilo-Newton (kN) force to a four-leg press-pin made of aluminum (Al). In FIG. 8A, the color scale 810 represents the deformation gradient in micrometer (m). The deformation map 800 indicates that tiny deformations (4.7 μm maximum) occur on the press-pin and zero on the SiC FET dies. In FIG. 8B, the color scale 860 represents the stress gradient in mega-Pascal (MPa). The stress map 850 indicates that The pressure on the four SiC FET dies ranges between 10-50 Mpa, which is adequate for quality contact and safely below a 380 Mpa fracture strength.

At the SSCB level, ideal resilience requires that the failure of any die, submodule, module, or ancillary circuit should neither interrupt a normal current nor compromise the breaking capacity. For that purpose, in an embodiment, normally-on FETs are combined with stable-short failure mode (SSFM) and N+1 redundancy for large stacks. This fault-tolerant design enables maintenance after ancillary failures without interruption, as opposed to the existing normally-off modules that will break current immediately and result in an economic loss.

Figure 9:
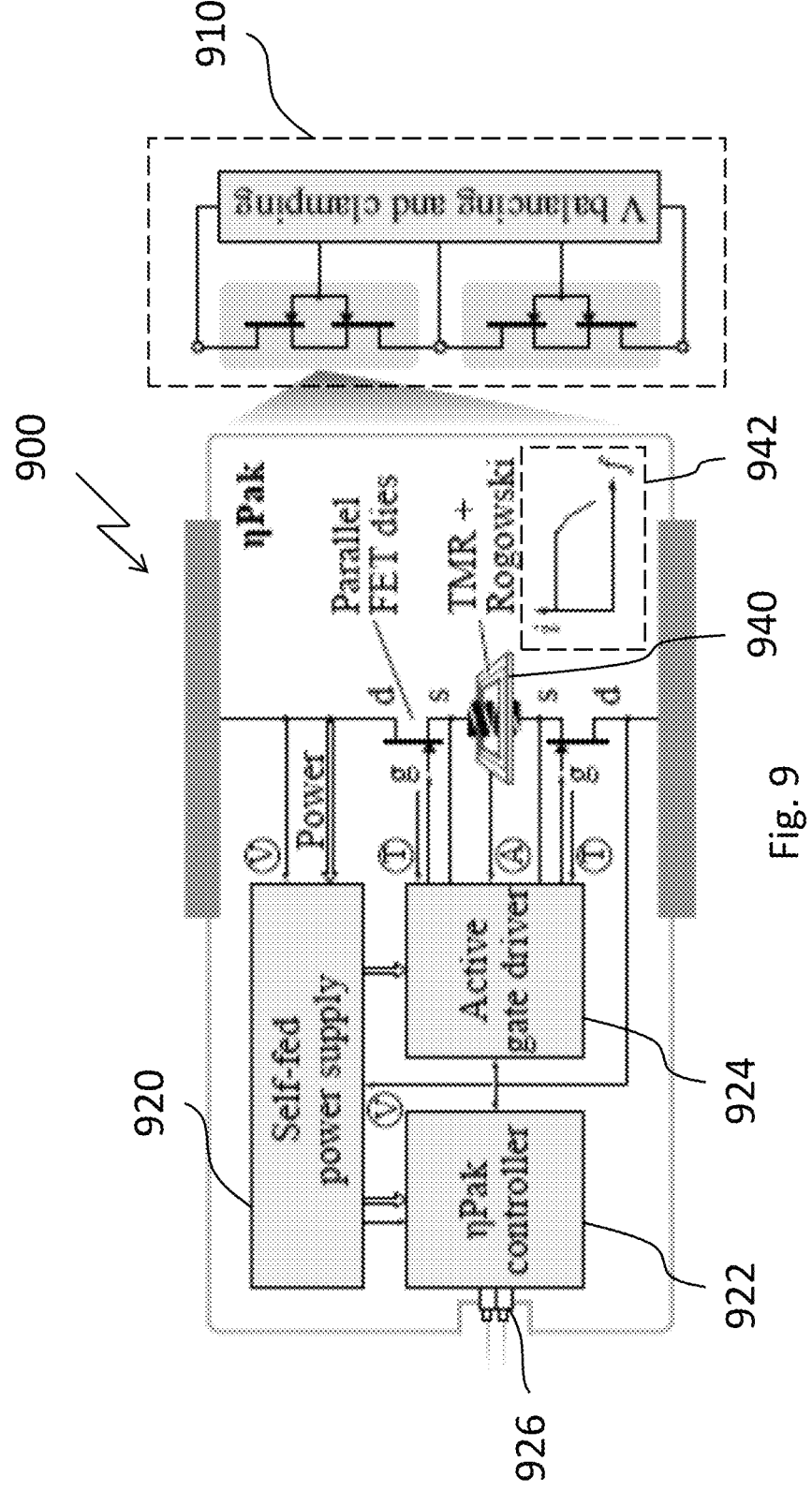
FIG. 9 is an electrical block diagram of a voltage balancing and clamping circuit.

In a further embodiment, a simple, reliable, and lossless voltage balancing and clamping circuit may be implemented for N+1 and N stacked modules. In an N stacked-module configuration, one module fails into Short Circuit Failure Mode (SCFM). FIG. 9 is an electrical block diagram 900 of a voltage balancing and clamping circuit, according to an embodiment. The voltage balancing and clamping circuit may be formed based on two or more ηPak modules in stack, in which case submodules are also in stack due to their aligned positions. Block 910 in FIG. 9 shows an equivalent circuit scheme to the block diagram 900. The self-fed power supply 920, the ηPak controller 922, and the active gate driver 924 may be included in the ancillary unit 314 as shown in FIG. 3A. The ηPak module may include at least one power interface and at least one control interface 926. In some examples, the control interface may include an optical interface. In FIG. 9, "V" stands for voltage, "T" stands for temperature, and "A" stands for current.

The electrical block diagram 900 shows a bidirectional variant of a super-cascode circuit that only requires switching the bottom module, eliminating strict control synchronization among all modules and featuring near-ideal voltage balancing.

In addition, additional implementations may provide more intelligence to enhance robustness. The implementations include (1) a hybrid current sensor 940 based on tunnel magnetoresistance (TMR) and a Rogowski coil with up to 20 kA peak and DC-30 MHz bandwidth (BW), enabling ultra-fast fault detection and transient monitoring; (2) a junction temperature sensor (not shown in FIG. 9) based on gate-bias voltage; and (3) online diagnosis, prognosis, and health status reporting through digital communication. The associated hardware and signal flow may be integrated as depicted in FIG. 9, according to an embodiment. Block 942 shows characteristics (in current I versus frequency f) of one or more elements (e.g., the Rogowski coil) in the hybrid current sensor 940. One or more current sensor (e.g., the hybrid current sensor 940) may be disposed in a path enclosing a drain-source path of at least one FET. One or more temperature sensors may be attached to the FETs in the ηPak module, for example, one temperature sensor may be attached to one FET. The sensors (e.g., temperature sensors and current sensors) may be connected to the control circuit in the ηPak module. The sensors may be used to monitor operating status of the FETs and cause generation of feedback control signals. The digital communication may be facilitated by circuits/components integrated in or coupled to the ancillary unit 314 as shown in FIG. 3A. A communication interface may be connected to the controller in the ηPak module and configured to report diagnosis, prognosis, and health status of the electronic module (e.g., the ηPak module) to an external device via the communication interface.

To overcome a technical challenge of a 52.5 μW packaging resistance goal, interlayer contact resistance may be modeled as a function of pressure, surface rugosity, and contact stiffness. Potential mitigation solutions may include pressure optimization, laser polishing, and metal-interposer on the FET's source pad. In particular, the press-pin may be optimized for homogeneous pressure distribution over four dies. In some embodiments, concerning robustness, the normally-on status at the system power-up stage may be undesirable, so a self-driving circuit that maintains an initial "off" state may be implemented. In some embodiments, to avoid imposing a high electric field on a grid-fed auxiliary power supply as the module number increases, a self-fed power supply may be used for unrestricted voltage scalability.

FIG. 10 compares different press-pack modules in a cross section view. The press-pack modules include (a) Rigid press-pack; (b) StakPak; (c) Dynex press-pack; and (d) ηPak. Module (a) uses one large block of copper to press contact many IGBT chips from the top and bottom side, which presents a pressure non-uniformity issue. Modules (b) and (c) are two types of compliant designs, which use a spring to provide contact pressure for each IGBT chip. However, Modules (b) and (c) are not suitable for small-pad-area SiC FETs. Besides, Modules (a)-(c) are all asymmetrical, unidirectional packages. Compared to these existing press-pack modules, Module (d), ηPak, has a spring structure with multiple small legs to accommodate the tiny SiC MOSFET pads. ηPak also features a symmetrical back-to-back structure to allow for bidirectional normal current flow and fault current interruption. Solder or Sintered joints may be made of different materials. The frames (e.g., housing)) in the press-pack modules may also be made of various materials, such as fiberglass and ceramic.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art. For example, when composition of matter are claimed, it should be understood that compounds known and available in the art prior to Applicant's invention, including compounds for which an enabling disclosure is provided in the references cited herein, are not intended to be included in the composition of matter claims herein.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements, limitation or limitations which is not specifically disclosed herein.

The use of the terms "a" and "an" and "the" and similar references in the context of describing the subject matter (particularly in the context of the following claims) are to be construed to cover both the singular and the plural, unless otherwise indicated herein or clearly contradicted by context. The use of the term "at least one" followed by a list of one or more items (for example, "at least one of A and B") is to be construed to mean one item selected from the listed items (A or B) or any combination of two or more of the listed items (A and B), unless otherwise indicated herein or clearly contradicted by context. Furthermore, the foregoing description is for the purpose of illustration only, and not for the purpose of limitation, as the scope of protection sought is defined by the claims as set forth hereinafter together with any equivalents thereof. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the invention as claimed.

One of ordinary skill in the art will appreciate that starting materials, biological materials, reagents, synthetic methods, purification methods, analytical methods, assay methods, and biological methods other than those specifically exemplified can be employed in the practice of the invention without resort to undue experimentation. All art-known functional equivalents, of any such materials and methods are intended to be included in this invention. The terms and expressions which have been employed are used as terms of description and not of limitation, and there is no intention that in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

What is claimed is:

1. An electronic module, comprising:
a plurality of first field effect transistors (FETs);
a plurality of second FETs, each second FET of the plurality of second FETs pairing with a respective first FET of the plurality of first FETs;
a controller, connected to gate nodes of the plurality of first FETs and the plurality of second FETs; and
a plurality of spring assemblies, disposed between the plurality of first FETs and the plurality of second FETs and pairing with the respective first FETs of the plurality of first FETs,
wherein each spring assembly of the plurality of spring assemblies comprises a disc spring that is clamped and at least one conductive path that connects both ends of the spring assembly, and wherein one end of each spring assembly is connected to a press-buffer that contacts at least one first FET and the other end of the particular spring assembly is connected to another press-buffer that contacts at least one second FET,
wherein drain nodes of the plurality of first FETs are connected to a first electrode plate, and drain nodes of the plurality of second FETs are connected to a second electrode plate; and
wherein each source node of the plurality of first FETs is connected to one end of a respective spring assembly, and each source node of the respective plurality of second FETs pairing with the plurality of first FETs is connected to the other end of the respective spring assembly.

2. The electronic module of claim 1, wherein the plurality of first FETs and the plurality of second FETs operate in a normally-on or a normally-off state.

3. The electronic module of claim 1, further comprising:
one or more current sensors connected to the controller, each current sensor comprising a sensing element based on tunnel magnetoresistance (TMR) and a Rogowski coil,
wherein each of the one or more current sensors is disposed in a path enclosing a drain-source path of at least one FET.

4. The electronic module of claim 1, further comprising:
one or more temperature sensors connected to the controller,
wherein each of the one or more temperature sensors is attached to a FET of the plurality of first FETs or the plurality of second FETs.

5. The electronic module of claim 1, further comprising:
a communication interface, connected to the controller and configured to report diagnosis, prognosis, and health status of the electronic module to an external device via the communication interface.

6. The electronic module of claim 1, wherein the plurality of first FETs and the plurality of second FETs are made of silicon carbide (SiC) or gallium nitride (GaN).

7. The electronic module of claim 1, wherein each press-buffer has two or more legs and each leg of a press-buffer is connected to a FET.

8. The electronic module of claim 7, wherein each spring assembly is connected to two or more first FETs of the plurality of first FETs and two or more respective second FETs of the plurality of second FETs that are paired with the two or more first FETs.

9. The electronic module of claim 1, wherein the plurality of first FETs and the plurality of second FETs are fabricated on FET dies, wherein each FET die comprises at least one FET of the plurality of first FETs or the plurality of second FETs.

10. The electronic module of claim 1, wherein the electronic module comprises hybrid electrical connections, wherein the hybrid electrical connections comprise wire-bonding for the gate nodes of the plurality of FETs, sintering or soldering for the drain and source nodes of the plurality of FETs, and dry contacts for the plurliaty of spring assemblies.

11. An electronic device, comprising:
a plurality of electronic modules;
a control circuit connected to the plurality of electronic modules; and
a frame providing mechanical support to and electrical connections between the plurality of electronic modules and the control circuit,
wherein each electronic module among the plurality of electronic modules comprises:
a plurality of first field effect transistors (FETs);
a plurality of second FETs, each second FET of the plurality of second FETs pairing with a respective first FET of the plurality of first FETs;
a controller, connected to gate nodes of the plurality of first FETs and the plurality of second FETs; and
a plurality of spring assemblies, disposed between the plurality of first FETs and the plurality of second FETs and pairing with the respective first FETs of the plurality of first FETs,
wherein each spring assembly of the plurality of spring assemblies comprises a disc spring that is clamped and at least one conductive path that connects both ends of the spring assembly, each spring assembly has two ends, wherein one end is connected to a press-buffer that contacts at least one first FET and the other end is connected to another press-buffer that contacts at least one second FET,
wherein drain nodes of the plurality of first FETs are connected to a first electrode plate, and drain nodes of the plurality of second FETs are connected to a second electrode plate; and
wherein each source node of the plurality of first FETs is connected to one end of a respective spring assembly, and each source node of the respective plurality of second FETs pairing with the plurality of first FETs is connected to the other end of the respective spring assembly.

12. The electronic device of claim 11, wherein each electronic module among the plurality of electronic modules further comprises:
one or more current sensors connected to the controller, each current sensor comprising a sensing element based on tunnel magnetoresistance (TMR) and a Rogowski coil,
wherein each of the one or more current sensors is disposed in a path enclosing a drain-source path of at least one FET.

13. The electronic device of claim 11, wherein each electronic module among the plurality of electronic modules further comprises:
one or more temperature sensors connected to the controller,
wherein each of the one or more temperature sensors is attached to a FET of the plurality of first FETs or the plurality of second FETs.

14. The electronic device of claim 11, wherein each electronic module among the plurality of electronic modules further comprises:

a communication interface, connected to the controller and configured to report diagnosis, prognosis, and health status of the electronic module to an external device via the communication interface.

15. The electronic device of claim 11, wherein the plurality of first FETs and the plurality of second FETs are made of silicon carbide (SiC) or gallium nitride (GaN).

16. The electronic device of device 11, wherein each press-buffer has two or more legs and each leg of a press-buffer is connected to a FET, and wherein each spring assembly is connected to two or more first FETs of the plurality of first FETs and two or more respective second FETs of the plurality of second FETs that are paired with the two or more first FETs.

17. The electronic device of claim 11, wherein each electronic module among the plurality of electronic modules comprises hybrid electrical connections, wherein the hybrid electrical connections comprise wire-bonding for the gate nodes of the plurality of FETs, sintering or soldering for the drain and source nodes of the plurality of FETs, and dry contacts for the plurality of spring assemblies.

18. The electronic device of claim 10, wherein the plurality of first FETs and the plurality of second FETs are fabricated on FET dies, wherein each FET die comprises at least one FET of the plurality of first FETs or the plurality of second FETs.

19. The electronic device of claim 10, wherein the plurality of electronic modules are arranged in an N+1 configuration.

20. The electronic device of claim 10, wherein each of the plurality of electronic modules is replaceable.

* * * * *